(12) United States Patent
Seo et al.

(10) Patent No.: US 7,728,644 B2
(45) Date of Patent: Jun. 1, 2010

(54) SKEW COMPENSATION CIRCUIT

(75) Inventors: Woo Hyun Seo, Seoul (KR); Yong Ho Kong, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/205,261

(22) Filed: Sep. 5, 2008

(65) Prior Publication Data

US 2009/0096500 A1      Apr. 16, 2009

(30) Foreign Application Priority Data

Oct. 12, 2007   (KR) ...................... 10-2007-0103027

(51) Int. Cl.
*G06F 1/04* (2006.01)
(52) U.S. Cl. ...................... 327/291; 327/262
(58) Field of Classification Search ........................ None
See application file for complete search history.

(56) References Cited

U.S. PATENT DOCUMENTS 5,345,239 A * 9/1994 Madni et al. .................. 342/14
7,487,379 B2 * 2/2009 Nguyen et al. .............. 713/600

FOREIGN PATENT DOCUMENTS

KR      1998-032106 A      7/1998

* cited by examiner

*Primary Examiner*—Cassandra Cox
(74) *Attorney, Agent, or Firm*—Ladas & Parry LLP

(57) ABSTRACT

The present invention describes a skew compensation circuit that can compensate for changes in signal skew in response to changes in external environments and processes. The skew compensation circuit includes a controller for outputting a control signal according to whether an external power supply is supplied and its operation mode. The skew compensation circuit also includes a signal output unit which selects either a normal path or a skew reduction path according to the control signal and outputs an input signal through the selected path.

24 Claims, 6 Drawing Sheets

SKEW COMPENSATION CIRCUIT

CROSS-REFERENCE TO RELATED APPLICATIONS

The present application claims priority to Korean patent application number 10-2007-0103027 filed on Oct. 12, 2007, which is incorporated herein by reference in its entirety.

BACKGROUND OF THE INVENTION

The present invention relates to a skew compensation circuit and more particularly to a skew compensation circuit which can compensate for changes in skew according to changes in external environments and processes.

Generally, transistors in a semiconductor device do not correspond to the designed threshold voltage, oxide thickness, gate, ISO and active resistance or the like, due to changes in external environments and processes which results in signal skew. Additionally, an operation for verifying changes in external environments and processes is very difficult.

In order to simulate and verify changes in external environments and processes, phased conditions such as 'FF, FT, FS, TF, TT, TS, SF, ST, SS' are used. Based on the 'TT,' there are predetermined skew differences between the respective conditions. Herein, 'F' means a fast condition, 'T' means a typical condition, and 'S' means a slow condition.

For example, as shown in FIG. 1, a conventional signal generating circuit generates an output signal OUT using an inverter chain 10, a NAND gate NA1, and inverters INV1, INV2. In this example, the slower the condition, the larger delay of the signal becomes due to the inverter chain 10.

In other words, in the typical condition as shown in FIG. 2A, an input signal IN1 is delayed by a predetermined amount by the inverter chain 10 while an input signal IN2 is inverted by the inverter INV1. The NAND gate NA1 NAND-combines a delayed signal IN1_DLY outputted by the inverter chain 10 and an inverted signal IN2B outputted by the inverter INV1. The inverter INV2 receives an output of the NAND gate NA1 and outputs a normal output signal OUT.

However, in the slow condition as shown in FIG. 2B, the inverter chain 10 may vary the delay amount according to changes in the transistors of the inverter chain 10, such as changes in a threshold voltage, oxide thickness, gate, ISO and active resistance or the like. Therefore, a timing margin between the delayed signal IN1_DLY and the inverted signal IN2B may be insufficient to output a normal signal OUT from the inverter INV2 or may not be sufficient to output a signal at all.

Circuit malfunctions due to a change in skew are not a big problem if changes in the external environment and processes can be accurately predicted. However, if the changes cannot be accurately predicted, it is difficult to correct the circuit malfunctions.

Further, although a certain degree of skew change can be accurately judged according to the prediction of changes in the external environment and processes, when the change in skew is severe, a further process to add or revise the circuit in order to compensate for the change in skew is needed. This extra process requires more time and added costs.

SUMMARY OF THE INVENTION

The present invention provides a skew compensation circuit which can easily compensate for a change in skew in response to changes in external environments and processes. In particular, the skew compensation circuit according to the present invention can be applied when the change in skew is severe or prediction of the changes in external environments and processes is difficult.

There is provided a skew compensation circuit according to a first embodiment of the present invention. The skew compensation circuit comprises: a controller which outputs a control signal in response to an external power and its operation mode; and a signal output unit that selects either a normal path or a skew reduction path according to the control signal, and outputs an input signal through the selected path.

In the configuration, preferably, the controller includes a fuse controlling a supply of the external power to the controller, and controls of the control signal according to whether the fuse is cut.

Preferably, the controller receives a test signal controlling an entry of either a normal node or a test mode, and controls a state of the control signal according to a state of the test signal.

Preferably, the signal output unit includes a transfer unit transferring the input signal to either the normal path or the skew reduction path according to a state of the control signal; a normal path unit outputting a signal transferred from the transfer unit through the normal path; and a skew reduction path unit outputting the signal transferred from the transfer unit through the skew reduction path.

In the configuration of the signal output unit, preferably, the normal path unit includes a first delay line delaying and outputting the signal transferred from the transfer unit through active devices, and the skew reduction path unit includes a second delay line delaying and outputting the signal transferred from the transfer unit through passive devices.

Preferably, the first delay line delays the signal transferred from the transfer unit through a plurality of transistors, and the second delay line delays the signal transferred from the transfer unit through a plurality of resistors and a plurality of capacitors.

There is provided a skew compensation circuit according to a second embodiment of the present invention. The skew compensation circuit comprises: a normal path unit having a normal delay path; a skew reduction path unit having a skew reduction delay path; and a transfer controller which selects either the normal path unit or the skew reduction path unit according to whether an external power supply is supplied and its operation mode, and the transfer controller transfers an input signal to the selected path unit.

In the configuration, the normal path unit includes a first delay line delaying and outputting the input signal transferred from the transfer controller through active devices, and the skew reduction path unit includes a second delay line delaying and outputting the input signal transferred from the transfer controller through passive devices.

Preferably, the first delay line delays the input signal through a plurality of transistors, and the second delay line delays the input signal through a plurality of resistors and a plurality of capacitors.

Preferably, the transfer controller transfers the input signal to either the normal path unit or the skew reduction path unit according to whether a fuse is cut which controls the supply of external power, and also the transfer controller transfers the input signals to either the normal path unit or the skew reduction path unit according to an entry of either a normal mode or a test mode.

Also, the transfer controller compensates for a skew in the input signal by selecting the skew reduction path unit when the skew due to the normal path unit is larger.

Preferably, the transfer controller routes the input signal to the skew reduction path unit by interrupting the external power supply by cutting the fuse included therein when the skew due to the normal path unit is larger.

Preferably, the transfer controller also routes the input signal to the skew reduction circuit according to a test signal corresponding to the entry of the test mode when the skew due to the normal path unit is larger.

There is provided a skew compensation circuit according to a third embodiment of the present invention. The skew compensation circuit comprises: a path controller which outputs path control signals according to whether an external power supply is supplied and its operation mode; and a plurality of internal circuits including normal paths and skew reduction paths respectively, wherein the plurality of internal circuits select either the normal paths or the skew reduction paths according to the respective path control signals, and the plurality of internal circuits output signals through the selected paths.

In the configuration, preferably, the path controller includes a controller generating a plurality of control signals having states according to whether the external power supply is supplied and the operation mode; and a decoder decoding the plurality of control signals to be outputted as the path control signals.

Preferably, the controller includes fuses controlling the supply of the external power to the controller, and controls the state of the control signals according to whether the fuses are cut.

Preferably, the controller receives test signals controlling an entry of either a normal node or a test mode, and controls the state of the control signals according to a state of the test signals.

Preferably, each internal circuit includes a transfer unit transferring signals to either the normal paths or the skew reduction paths according to a state of the path control signals; a normal path unit outputting the signals transferred from the transfer unit through the normal paths; and a skew reduction path unit outputting the signals transferred from the transfer unit through the skew reduction paths.

In the configuration of each internal circuit, preferably, the normal path unit includes a first delay line delaying and outputting the signals transferred from the transfer unit through active devices, and the skew reduction path unit includes a second delay line delaying and outputting the signals transferred from the transfer unit through passive devices.

Preferably, the first delay line delays the signals transferred from the transfer unit through a plurality of transistors, and the second delay line delays the signals transferred from the transfer unit through a plurality of resistors and a plurality of capacitors.

DESCRIPTION OF SPECIFIC EMBODIMENTS

Hereinafter, preferred embodiments of the present invention will be described in detail with reference to the accompanying drawings.

The present invention discloses a skew compensation circuit that selects either a normal path or skew reduction path of a predetermined internal circuit according to a degree of a change in skew, and allows signals to pass through the selected path to compensate for the skew change according to changes in external environments and processes.

Figure 1:
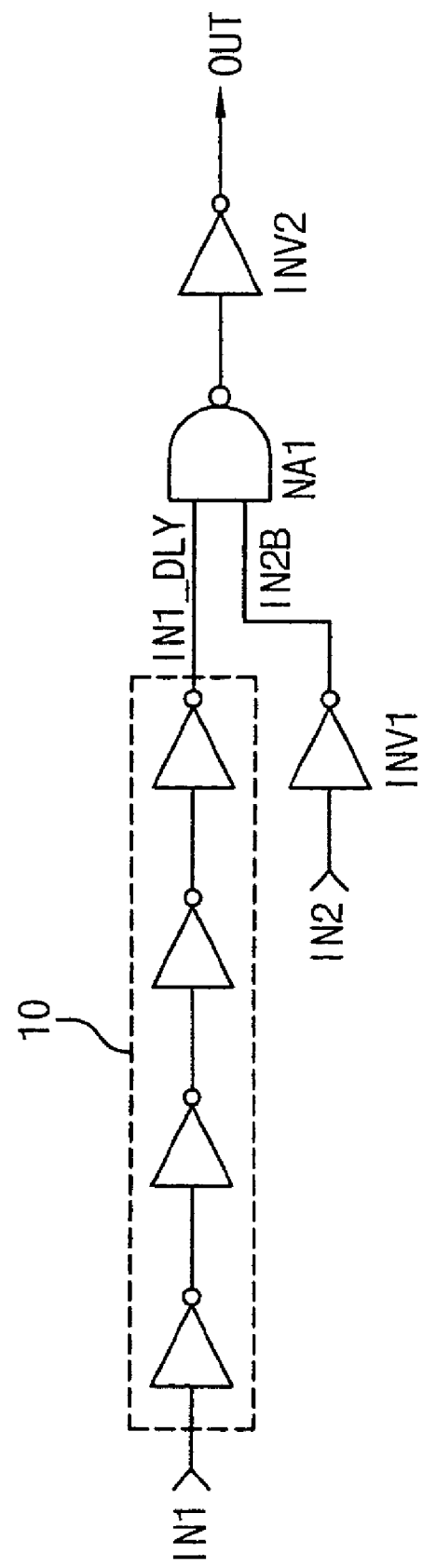
FIG. 1 is a circuit diagram showing a conventional circuit where a change in skew is severe.
Figure 2A:
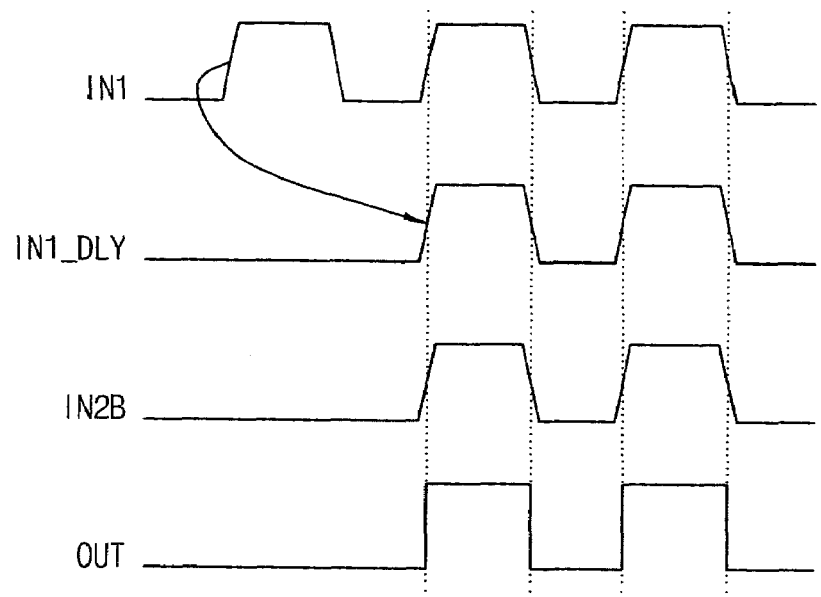
FIG. 2A is a waveform diagram showing operational characteristics of FIG. 1 in a typical condition.
Figure 2B:
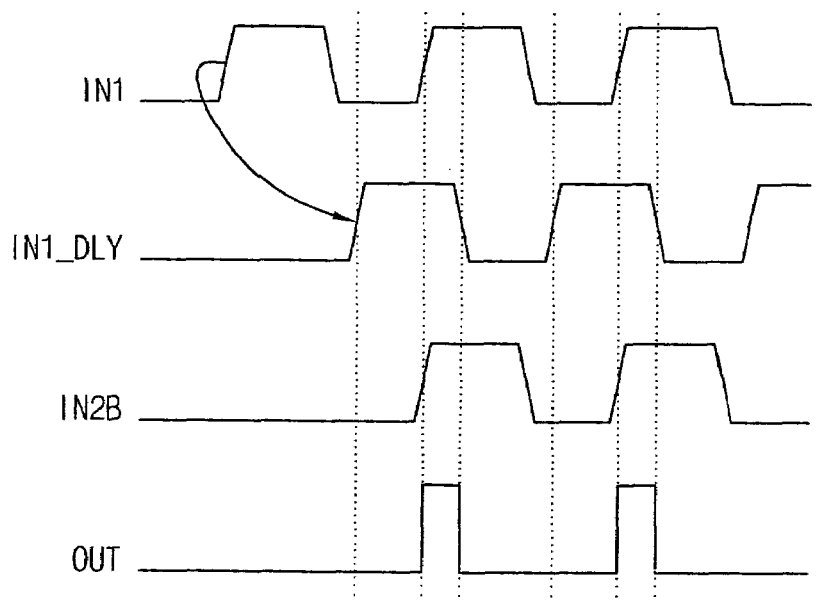
FIG. 2B is a waveform diagram showing operational characteristics of FIG. 1 in a slow condition.
Figure 3:
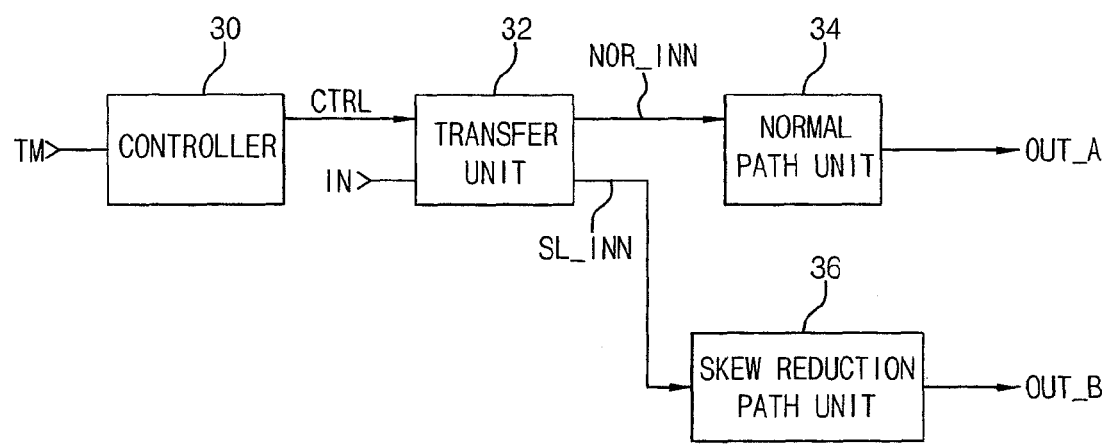
FIG. 3 is a block diagram showing a skew change circuit according to an embodiment of the present invention.

More specifically, the skew compensation circuit according to a first embodiment of the present invention, as shown in FIG. 3, may include a controller 30 and a signal output unit.

The controller 30 outputs a control signal CTRL for selecting a path according to whether an external power supply is supplied and its operation mode.

The signal output unit selects either a normal path or a skew reduction path according to the control signal CTRL and outputs an input signal IN through the selected path. Herein, the signal output unit may include a transfer unit 32, a normal path unit 34, and a skew reduction path unit 36.

More specifically, the controller 30 enables and outputs the control signal CTRL when predetermined power is externally supplied. The controller 30 also enables and outputs the control signal CTRL when it enters a specific mode other than the normal mode. Herein, a case where the skew is large corresponds to when predetermined power is externally supplied or the controller enters the specific mode.

Figure 4:
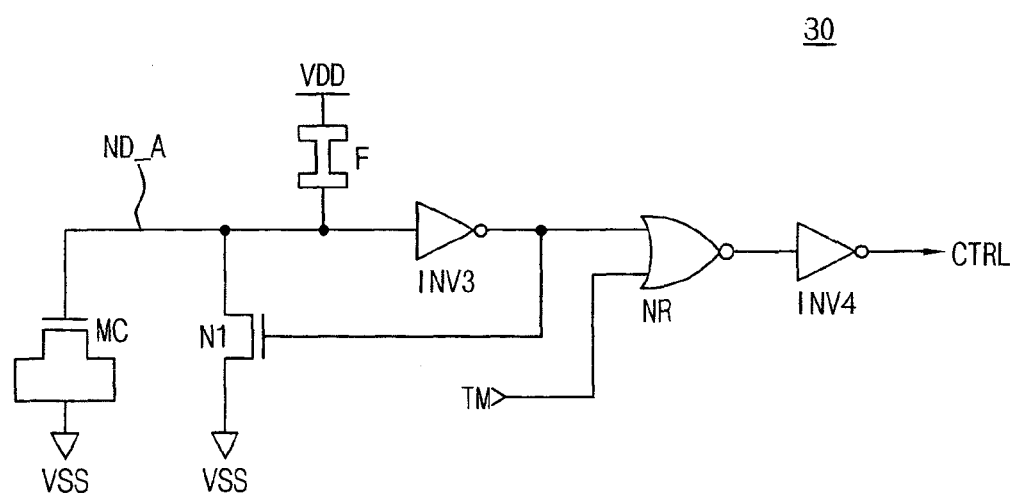
FIG. 4 is a circuit diagram showing a configuration of the controller 30 in FIG. 3.

As shown in FIG. 4, the controller 30 may have a configuration to output the control signal CTRL with a state according to the cutting of a fuse F controlling the supply of external power. The controller 30 may also have a configuration to output the control signal CTRL state according to the entry of either the normal mode or test mode.

The controller 30 includes the fuse F connected between an external power supply VDD and a node ND_A, a MOS capacitor MC connected between the node ND_A and a ground VSS, a pull down transistor N1 connected between the node ND_A and the ground VSS having a gate connected to an output terminal of an inverter INV3, an inverter INV3 inverting and outputting a potential of the node ND_A, a NOR gate NR NOR-combining an output from the inverter INV3 and a test signal TM, and an inverter INV4 inverting an output from the NOR gate NR to be outputted as the control signal CTRL. Herein, the test signal TM is a signal which is disabled in normal mode and enabled in test mode.

An operation of the controller 30 having the configuration as shown in FIG. 4 will now be described. When the external power VDD is supplied, i.e., when the fuse F is not cut, the node ND_A is maintained at a high level such that whether the control signal CTRL is enabled or not is determined according to a state of the test signal TM. At this time, the MOS capacitor MC is charged with the external power VDD.

When the external power VDD is not supplied, i.e., when the fuse F is cut, the power charged in the MOS capacitor MC is discharged to the node ND_A. The node ND_A is maintained at a low level by a latch operation of the inverter INV3 and the pull down transistor N1 after a predetermined time elapses. The node ND_A is maintained at the low level so that the control signal CTRL maintains the enable state irrespective of the state of the test signal TM.

Meanwhile, when entered into test mode, i.e., when the test signal TM is enabled, the control signal CTRL maintains the enable state irrespective of the state of the fuse F.

Referring back to FIG. 3, the transfer unit 32 may have a configuration which transfers the input signal IN to the normal path unit 34 when the control signal CTRL is in the disabled state and transfers the input signal IN to the skew reduction path unit 36 when the control signal CTRL is in the enabled state.

Figure 5:
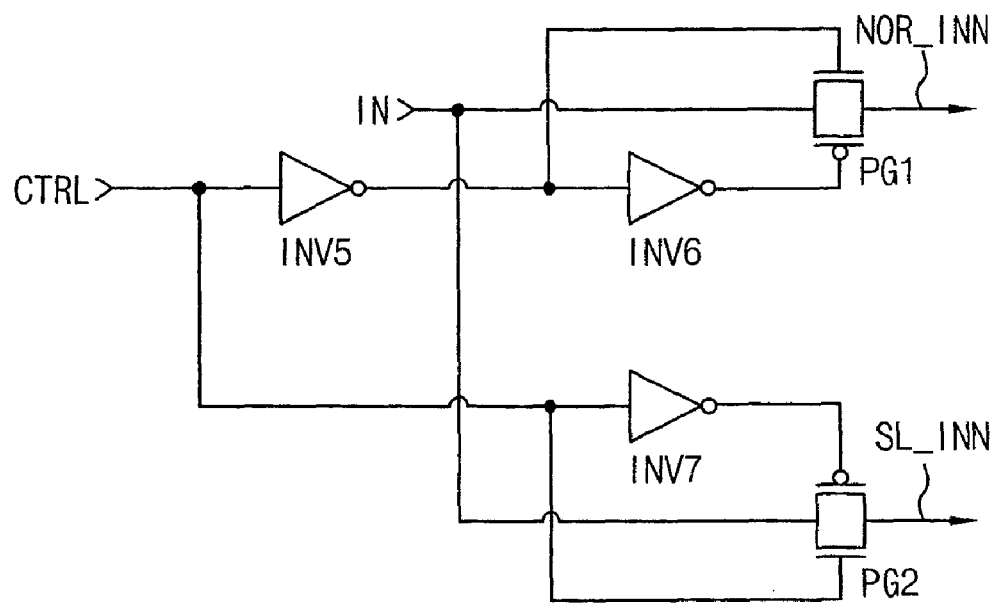
FIG. 5 is a circuit diagram showing a configuration of the transfer unit 32 in FIG. 3.

As shown in FIG. 5, the transfer unit 32 includes an inverter INV5 inverting the control signal CTRL, an inverter INV6 inverting an output from the inverter INV5, a pass gate PG1 selectively transferring the input signal IN to an input terminal NOR_INN of the normal path unit 34 according to the output from the inverter INV5 and an inverter INV6. The transfer unit 32 also includes an inverter INV7 inverting the control signal CTRL and a pass gate PG2 selectively transferring the input signal IN to an input terminal SL_INN of the skew reduction path unit 36 according to the control signal CTRL and an output from the inverter INV7.

Referring back to FIG. 3, the normal path unit 34 outputs the input signal IN as an output signal OUT_A through the normal path when the input signal IN is transferred to the input terminal NOR_INN through the transfer unit 32. The skew reduction path unit 36 outputs the input signal IN as an output signal OUT_B through a path with a reduced skew when the input signal IN is transferred to the input terminal SL_INN through the transfer unit 32.

The normal path unit 34 includes a delay line which delays the input signal IN to be outputted as the output signal OUT_A. Like the normal path unit 34, the skew reduction path unit 36 may include a delay line which delays the input signal IN to be outputted as the output signal OUT_B. However, the delay line in the normal path unit 34 may be formed of active devices, and the delay line in the skew reduction path unit 36 may be formed of passive devices with a small skew change.

Figure 6:
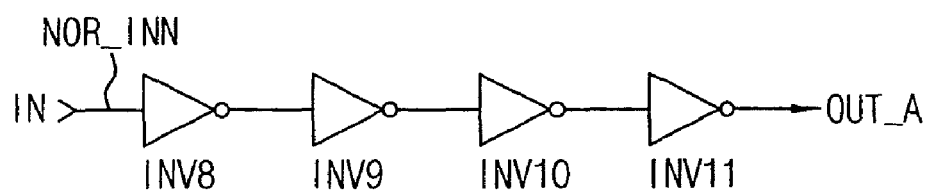
FIG. 6 is a circuit diagram showing a configuration of the normal path unit 34 in FIG. 3.

As shown in FIG. 6, the normal path unit 34 may have a structure including a chain of inverters INV8 to INV11 for delaying the input signal IN to be outputted as the output signal OUT_A.

Figure 7:
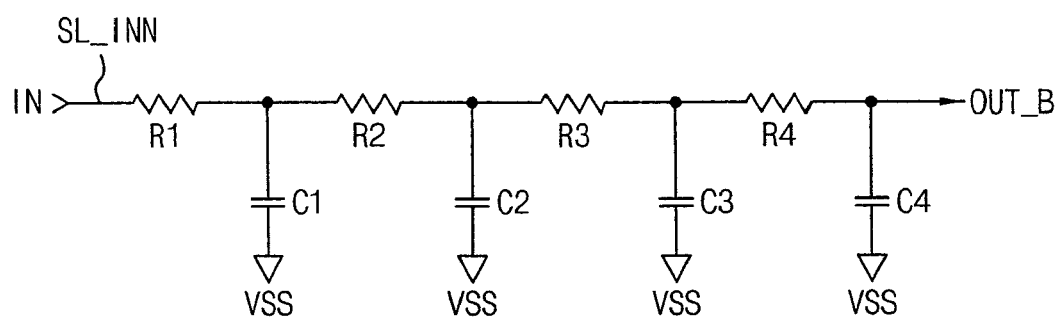
FIG. 7 is a circuit diagram showing a configuration of the skew reduction path unit 36 in FIG. 3 corresponding to the configuration of the normal path unit 34 in FIG. 6.

As shown in FIG. 7, the skew reduction path unit 36 corresponding to the normal path unit 34 of FIG. 6, includes a plurality of resistors R1 to R4 and a plurality of capacitors C1 to C4 which RC-delay the input signal IN to be outputted as the output signal OUT_B.

According to a second embodiment of the present invention, the skew compensation circuit may include the normal path unit which outputs the input signal IN through the normal path, a skew reduction path unit which outputs the input signal IN through the skew reduction path, and a transfer controller which transfers the input signal IN to either the normal path unit or the skew reduction path unit according to whether the external power supply is supplied and its operation mode. Herein, the normal path unit may correspond to the normal path unit 36 of FIG. 3, the skew reduction path unit may correspond to the skew reduction path unit 36 of FIG. 3, and the transfer controller may correspond to a configuration including the controller 30 and the transfer unit 32 of FIG. 3.

According to a third embodiment of the present invention, the skew compensation circuit may include a path select unit which selects either the normal path or the skew reduction path according to whether the external power supply is supplied and its operation mode and accordingly routes the input signal IN to the selected path. When the normal path skew is large, the path select unit selects the skew reduction path to output the input signal IN through the skew reduction path to compensate for the skew. Herein, the path select unit may correspond to a configuration including the controller 30, the transfer unit 32, the normal path unit 34, and the skew reduction path unit 36 of FIG. 3.

As described above, the skew compensation circuit according to the first through third embodiments processes a signal through either the normal path or the skew reduction path when the change in skew is severe to effectively compensate for the change in skew. In other words, the skew compensation circuit according to the first through third embodiments processes the signal in the normal path when the output signal skew is small and processes the signal in the skew reduction path when the output signal skew is large to reduce the skew.

In particular, the skew compensation circuit according to the first through third embodiments is applied to a circuit where it is difficult to predict the changes in external environments and processes so as to allow the circuit to easily select either the normal path or the skew reduction path. This makes it possible to perform revisions in response to the change in skew. The skew compensation circuit according to the first through third embodiments can be widely applied to a circuit using an inverter delay in which the change in skew is severe.

Figure 8:
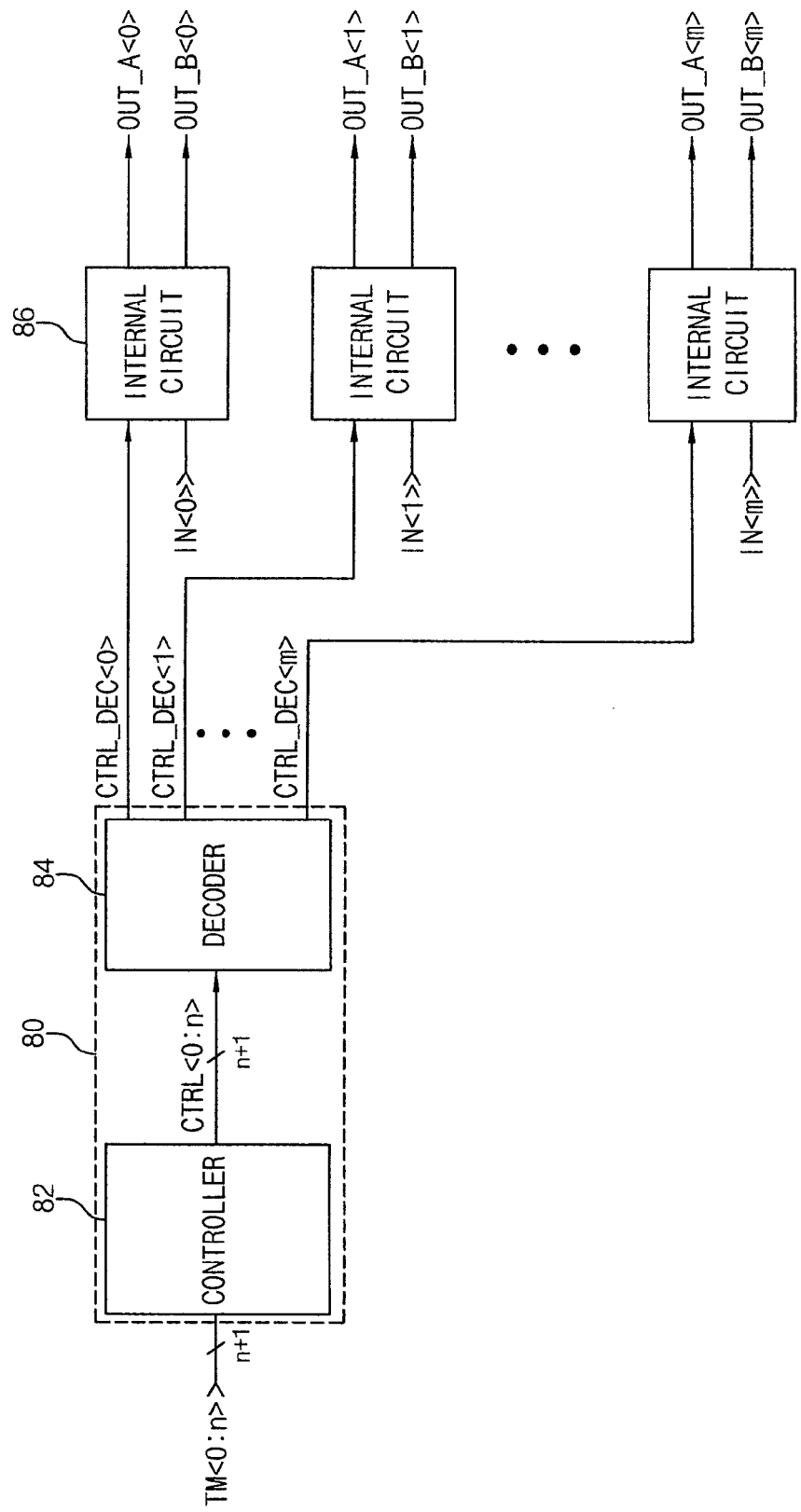
FIG. 8 is a block diagram showing a skew change circuit according to another embodiment of the present invention.

As shown in FIG. 8, the skew compensation circuit according to a fourth embodiment of the present invention includes a path controller 80 and a plurality of internal circuits 86.

The path controller 80 includes a controller 82 and a decoder 84, and outputs path control signals CTRL_DEC<0:m> (wherein 'm' is natural numbers larger than 'n' to be described later) for selecting paths according to whether an external power supply is supplied and its operation mode.

Herein, the controller 82 outputs path control signals CTRL<0:n> (wherein 'n' is natural numbers equal to or larger than 1) for selecting paths according to whether the external power supply is supplied and its operation mode. Herein, the controller 80 may include a plurality of the same components as in FIG. 4 and may determine the state of the plurality of control signals CTRL<0:n> according to the test signals TM<0:n> and fuses included in each component.

The decoder 84 decodes the control signals CTRL<0:n> to output the plurality of path control signals CTRL_DEC <0:m>.

Each internal circuit 86 includes the normal path and the skew reduction path and selects either the normal path or the skew reduction path according to the respective path control signal CTRL_DEC <0:m>. Each internal circuit 86 outputs the corresponding input signal IN<0:m> as output signal OUT_A<0:m> or OUT_B<0:m> through the selected path. Herein, each internal circuit 86 may include the transfer unit 32, the normal path unit 34, and the skew reduction path unit 36 of FIG. 3.

The skew compensation circuit according to the fourth embodiment of the present invention as described above can compensate for the skew in the signals of the plurality of internal circuits 86 through the decoder 84 so that it can be applied advantageously when it is difficult to predict changes in external environments and processes or when there are the plurality of circuits in which the change in skew is severe.

The skew compensation circuit according to the present invention processes signals through either the normal path or the skew reduction path in the circuit in which the change in skew is severe, making it possible to effectively compensate for the change in skew.

The skew compensation circuit according to the present invention is applied to the circuit where it is difficult to predict changes in external environments and processes in order to easily select either the normal path or the skew reduction path, making it possible to perform revisions in response to the change in skew.

Furthermore, the skew compensation circuit according to the present invention properly selects the normal paths or the skew reduction paths of the plurality of internal circuits through the decoder, making it possible to compensate for the changes in skew occurring in the plurality of circuits.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A skew compensation circuit comprising:
    a controller outputting a control signal in response to an external power supply voltage and a test signal having information of an operation mode; and
    a signal output unit that selects either a normal path or a skew reduction path according to the control signal and outputs an input signal through a selected one of the normal path and the skew reduction path.

2. The skew compensation circuit as set forth in claim 1, wherein the controller includes a fuse controlling a supply of the external power supply voltage to the controller, and controls a state of the control signal according to whether the fuse is cut.

3. The skew compensation circuit as set forth in claim 1, wherein the test signal is disabled in a normal mode and enabled in a test mode.

4. The skew compensation circuit as set forth in claim 1, wherein the signal output unit includes:
    a transfer unit transferring the input signal to either the normal path or the skew reduction path according to a state of the control signal;
    a normal path unit outputting a signal transferred from the transfer unit through the normal path; and
    a skew reduction path unit outputting the signal transferred from the transfer unit through the skew reduction path.

5. The skew compensation circuit as set forth in claim 4, wherein the normal path unit includes a first delay line delaying and outputting the signal transferred from the transfer unit through active devices, and the skew reduction path unit includes a second delay line delaying and outputting the signal transferred from the transfer unit through passive devices.

6. The skew compensation circuit as set forth in claim 5, wherein the first delay line delays the signal transferred from the transfer unit through a plurality of transistors.

7. The skew compensation circuit as set forth in claim 5, wherein the second delay line delays the signal transferred from the transfer unit through a plurality of resistors and a plurality of capacitors.

8. A skew compensation circuit comprising:
    a normal path unit having a normal delay path;
    a skew reduction path unit having a skew reduction delay path; and
    a transfer controller which selects either the normal path unit or the skew reduction path unit according to whether an external power supply is supplied and its operation mode, and the transfer controller transfers an input signal to the selected path unit.

9. The skew compensation circuit as set forth in claim 8, wherein the normal path unit includes a first delay line delaying and outputting a signal transferred from the transfer controller through active devices, and the skew reduction path unit includes a second delay line delaying and outputting the signal transferred from the transfer controller through passive devices.

10. The skew compensation circuit as set forth in claim 9, wherein the first delay line delays the signal transferred from the transfer controller through a plurality of transistors.

11. The skew compensation circuit as set forth in claim 9, wherein the second delay line delays the signal transferred from the transfer controller through a plurality of resistors and a plurality of capacitors.

12. The skew compensation circuit as set forth in claim 8, wherein the transfer controller transfers the input signal to either the normal path unit or the skew reduction path unit according to whether a fuse is cut which controls the supply of external power.

13. The skew compensation circuit as set forth in claim 8, wherein the transfer controller transfers the input signal to either the normal path unit or the skew reduction path unit according to an entry of either a normal mode or a test mode.

14. The skew compensation circuit as set forth in claim 8, wherein the transfer controller compensates for a skew in the input signal by selecting the skew reduction path unit when the skew due to the normal path unit is larger.

15. The skew compensation circuit as set forth in claim 14, wherein the transfer controller routes the input signal to the skew reduction path unit by interrupting the external power supply by cutting the fuse included therein when the skew due to the normal path unit is larger.

16. The skew compensation circuit as set forth in claim 14, wherein the transfer controller routes the input signal to the skew reduction circuit according to a test signal corresponding to the entry of the test mode when the skew due to the normal path unit is larger.

17. A skew compensation circuit comprising:
    a path controller which outputs path control signals according to whether an external power supply is supplied and its operation mode; and
    a plurality of internal circuits including normal paths and skew reduction paths respectively,
    wherein the plurality of internal circuits select either the normal paths or the skew reduction paths according to the respective path control signals, and the plurality of internal circuits output signals through the selected paths.

18. The skew compensation circuit as set forth in claim 17, wherein the path controller includes:
    a controller generating a plurality of control signals having states according to whether the external power supply is supplied and the operation mode; and
    a decoder decoding the plurality of control signals to be outputted as the path control signals.

19. The skew compensation circuit as set forth in claim 18, wherein the controller includes fuses controlling the supply of the external power to the controller, and controls the state of the control signals according to whether the fuses are cut.

20. The skew compensation circuit as set forth in claim 18, wherein the controller receives test signals controlling an entry of either a normal mode or a test mode, and controls the state of the control signals according to a state of the test signals.

21. The skew compensation circuit as set forth in claim 17, wherein each internal circuit includes:

a transfer unit transferring signals to either the normal paths or the skew reduction paths according to a state of the path control signals;

a normal path unit outputting the signals transferred from the transfer unit through the normal paths; and a skew reduction path unit outputting the signals transferred from the transfer unit through the skew reduction paths.

22. The skew compensation circuit as set forth in claim 21, wherein the normal path unit includes a first delay line delaying and outputting the signals transferred from the transfer unit through active devices, and the skew reduction path unit includes a second delay line delaying and outputting the signals transferred from the transfer unit through passive devices.

23. The skew compensation circuit as set forth in claim 22, wherein the first delay line delays the signals transferred from the transfer unit through a plurality of transistors.

24. The skew compensation circuit as set forth in claim 22, wherein the second delay line delays the signals transferred from the transfer unit through a plurality of resistors and a plurality of capacitors.

* * * * *